US008952545B2

(12) United States Patent
Otremba et al.

(10) Patent No.: US 8,952,545 B2
(45) Date of Patent: Feb. 10, 2015

(54) ELECTRONIC DEVICE INCLUDING A CARRIER AND A SEMICONDUCTOR CHIP ATTACHED TO THE CARRIER AND MANUFACTURING THEREOF

(71) Applicant: Infineon Technologies AG, Neubiberg (DE)

(72) Inventors: Ralf Otremba, Kaufbeuren (DE); Henrik Ewe, Burglengenfeld (DE); Klaus Schiess, Allensbach (DE); Manfred Mengel, Bad Abbach (DE)

(73) Assignee: Infineon Technologies AG, Neubiberg (DE)

( * ) Notice: Subject to any disclaimer, the term of this patent is extended or adjusted under 35 U.S.C. 154(b) by 8 days.

(21) Appl. No.: 13/965,630

(22) Filed: Aug. 13, 2013

(65) Prior Publication Data

US 2013/0328213 A1 Dec. 12, 2013

Related U.S. Application Data

(62) Division of application No. 12/050,552, filed on Mar. 18, 2008, now Pat. No. 8,507,320.

(51) Int. Cl.
*H01L 23/48* (2006.01)
*H01L 23/36* (2006.01)
(Continued)

(52) U.S. Cl.
CPC .............. *H01L 23/481* (2013.01); *H01L 23/36* (2013.01); *H01L 23/49816* (2013.01); *H01L 23/49827* (2013.01); *H01L 23/5389* (2013.01); *H01L 24/25* (2013.01); *H01L 24/82* (2013.01); *H01L 24/97* (2013.01); *H01L 21/50* (2013.01); *H01L 23/48* (2013.01); *H01L 2224/18* (2013.01); *H01L 2224/76155* (2013.01); *H01L 2224/82039* (2013.01); *H01L 2224/82047* (2013.01);
(Continued)

(58) Field of Classification Search
USPC .................................. 257/774, 773; 438/121
See application file for complete search history.

(56) References Cited

U.S. PATENT DOCUMENTS 6,306,680 B1 * 10/2001 Fillion et al. .................. 438/106
6,590,291 B2 * 7/2003 Akagawa ...................... 257/774
(Continued)

FOREIGN PATENT DOCUMENTS

DE 102004007009 9/2005

OTHER PUBLICATIONS

The Restriction Requirement for U.S. Appl. No. 12/050,552 mailed Aug. 17, 2010 (9 pgs.).
(Continued)

*Primary Examiner* — Caleb Henry
(74) *Attorney, Agent, or Firm* — Dicke, Billig & Czaja, PLLC

(57) ABSTRACT

One aspect is a device including a carrier comprising a first conducting layer, a first insulating layer over the first conducting layer, and at least one first through-connection from a first face of the first insulating layer to a second face of the first insulating layer. A semiconductor chip is attached to the carrier and a second insulating layer is over the carrier and the semiconductor chip. A metal layer is over the second insulating layer. A second through-connection is through the second insulating layer electrically coupling the semiconductor chip to the metal layer. A third through-connection is through the second insulating layer electrically coupling the carrier to the metal layer.

10 Claims, 11 Drawing Sheets

(51) Int. Cl.
*H01L 23/498* (2006.01)
*H01L 23/538* (2006.01)
*H01L 23/00* (2006.01)
*H01L 21/50* (2006.01)

(52) U.S. Cl.
CPC ... *H01L2224/92144* (2013.01); *H01L 2224/97* (2013.01); *H01L 2924/01013* (2013.01); *H01L 2924/01027* (2013.01); *H01L 2924/01029* (2013.01); *H01L 2924/01046* (2013.01); *H01L 2924/01047* (2013.01); *H01L 2924/01078* (2013.01); *H01L 2924/01079* (2013.01); *H01L 2924/01082* (2013.01); *H01L 2924/01327* (2013.01); *H01L 2924/10329* (2013.01); *H01L 2924/12044* (2013.01); *H01L 2924/13055* (2013.01); *H01L 2924/13091* (2013.01); *H01L 2924/14* (2013.01); *H01L 2924/15311* (2013.01); *H01L 2924/01005* (2013.01); *H01L 2924/01006* (2013.01); *H01L 2924/01023* (2013.01); *H01L 2924/01024* (2013.01); *H01L 2924/01033* (2013.01); *H01L 2924/01087* (2013.01); *H01L 2224/82102* (2013.01)
USPC .......................... 257/774; 257/773; 438/121

(56) References Cited

U.S. PATENT DOCUMENTS

| | | | | |
|---|---|---|---|---|
| 6,812,048 | B1 * | 11/2004 | Kline | 438/17 |
| 6,838,750 | B2 * | 1/2005 | Nuytkens et al. | 257/666 |
| 7,071,550 | B2 * | 7/2006 | Sato | 257/706 |
| 7,262,444 | B2 * | 8/2007 | Fillion et al. | 257/177 |
| 7,282,394 | B2 * | 10/2007 | Cho et al. | 438/118 |
| 7,341,890 | B2 * | 3/2008 | Ishimaru et al. | 438/125 |
| 8,138,587 | B2 * | 3/2012 | Otremba | 257/676 |
| 2001/0048156 | A1 * | 12/2001 | Fukuizumi | 257/728 |
| 2005/0161785 | A1 * | 7/2005 | Kawashima et al. | 257/678 |
| 2006/0284207 | A1 * | 12/2006 | Park et al. | 257/99 |
| 2007/0052086 | A1 * | 3/2007 | Oi et al. | 257/698 |
| 2007/0076390 | A1 * | 4/2007 | Kroener et al. | 361/760 |
| 2007/0096289 | A1 * | 5/2007 | Enomoto et al. | 257/687 |
| 2007/0132079 | A1 * | 6/2007 | Otremba et al. | 257/685 |
| 2007/0145573 | A1 * | 6/2007 | Otremba | 257/718 |
| 2007/0155176 | A1 * | 7/2007 | Nuytkens et al. | 438/678 |
| 2007/0262346 | A1 * | 11/2007 | Otremba et al. | 257/177 |
| 2009/0236749 | A1 | 9/2009 | Otremba et al. | |

OTHER PUBLICATIONS

The Office Action for U.S. Appl. No. 12/050,552 mailed Oct. 29, 2010 (13 pgs.).
Final Office Action for U.S. Appl. No. 12/050,552 mailed Apr. 6, 2011 (10 pgs.).
The Advisory Action for U.S. Appl. No. 12/050,552 mailed Jun. 15, 2011 (2 pgs.).
The Office Action for U.S. Appl. No. 12/050,552 mailed Sep. 29, 2011 (10 pgs.).
The Final Office Action for U.S. Appl. No. 12/050,552 mailed Apr. 2, 2012 (11 pgs.).
The Advisory Action for U.S. Appl. No. 12/050,552 mailed Jun. 14, 2012 (3 pgs.).
The Notice of Allowance for U.S. Appl. No. 12/050,552 mailed Apr. 11, 2013 (10 pgs.).

* cited by examiner

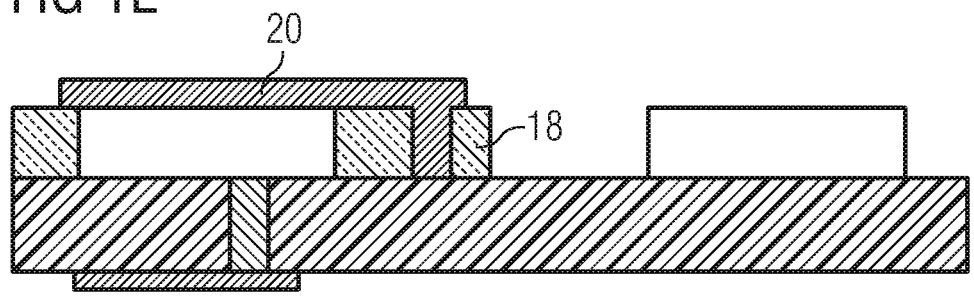
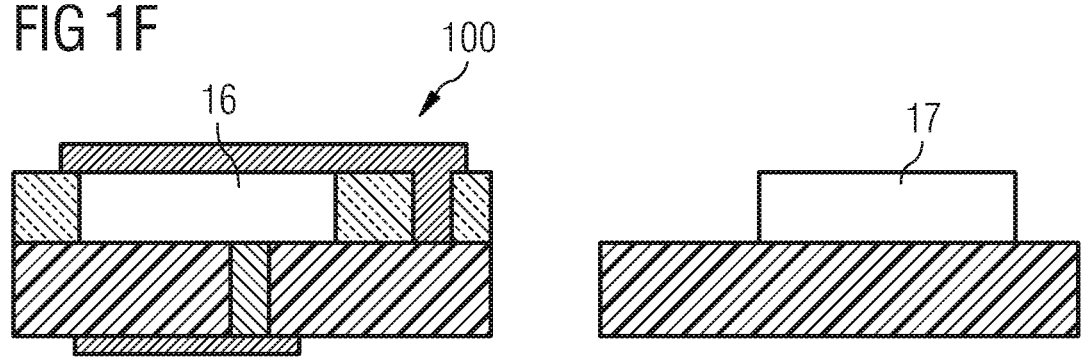
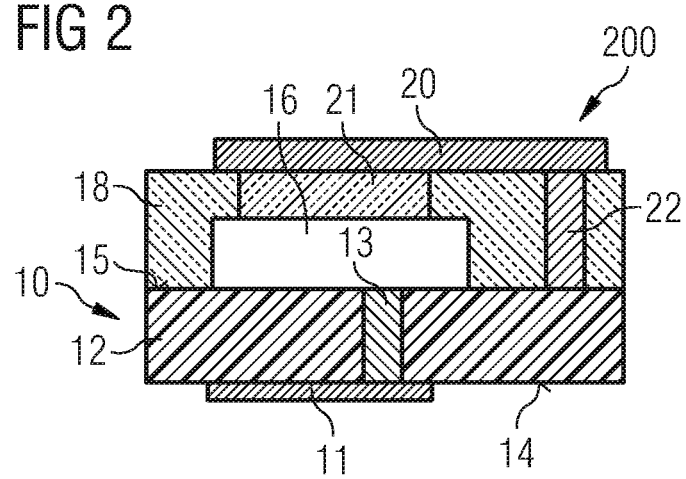

FIG 4A  A-A'
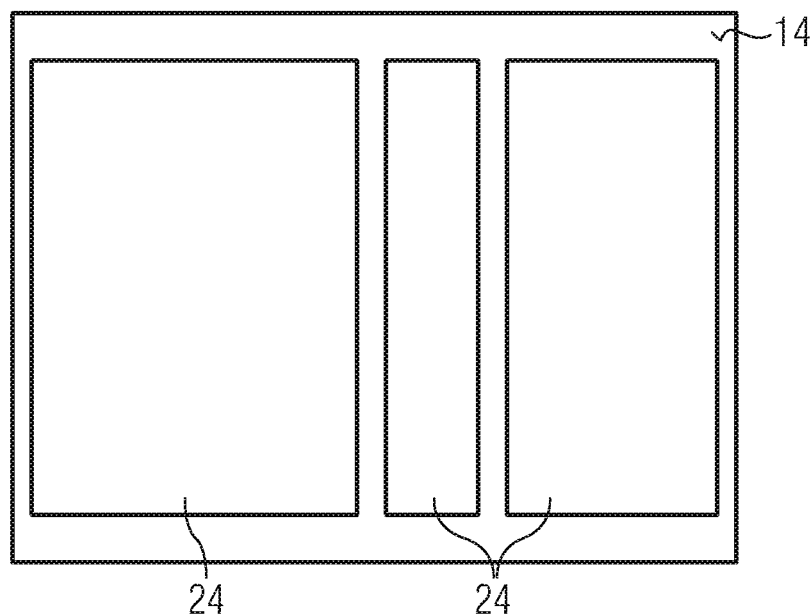
FIG 4B  B-B'
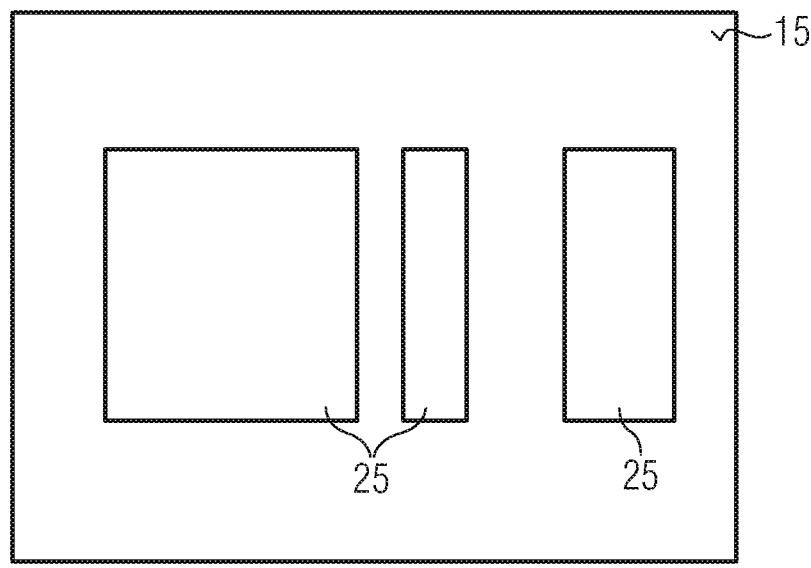

FIG 4C   C-C'
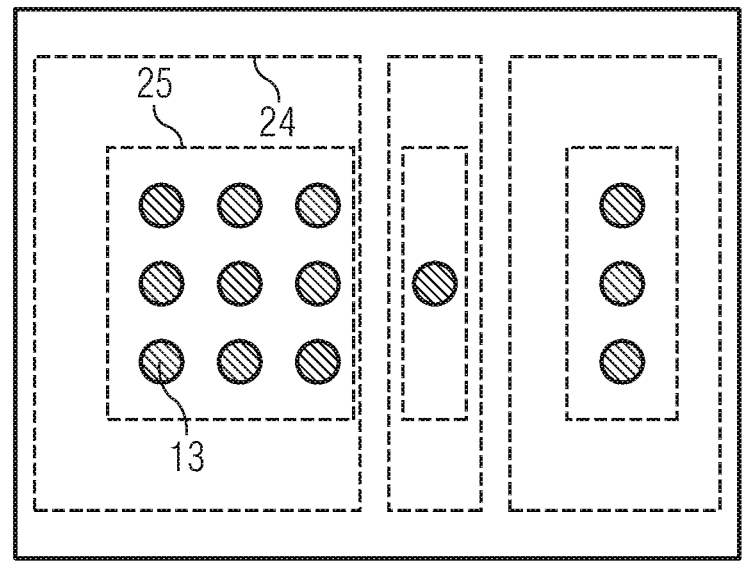
FIG 4D   C-C'
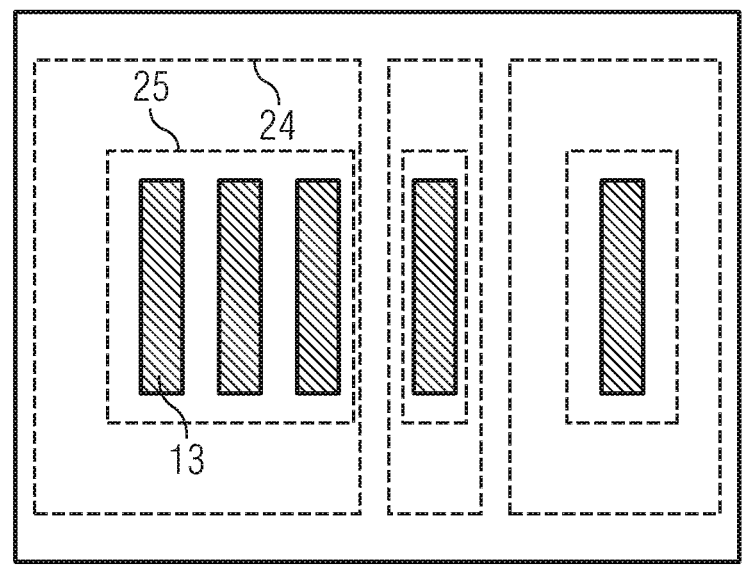

ELECTRONIC DEVICE INCLUDING A CARRIER AND A SEMICONDUCTOR CHIP ATTACHED TO THE CARRIER AND MANUFACTURING THEREOF

CROSS-REFERENCE TO RELATED APPLICATIONS

This application is a divisional of U.S. patent application Ser. No. 12/050,552, entitled "ELECTRONIC DEVICE INCLUDING A CARRIER AND A SEMICONDUCTOR CHIP ATTACHED TO THE CARRIER AND MANUFACTURING THEREOF," having a filing date of Mar. 18, 2008, of which is incorporated herein by reference.

BACKGROUND

One aspect relates to an electronic device and a method of manufacturing thereof.

Power semiconductor chips may, for example, be integrated into electronic devices. Power semiconductor chips are suitable, for example, for the switching or control of currents and/or voltages. Power semiconductor chips may, for example, be implemented as power MOSFETs, IGBTs, JFETs, power bipolar transistors or power diodes.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 1A to 1F schematically illustrate an exemplary embodiment of a method to fabricate a device 100.

FIG. 2 schematically illustrates a device 200 as an exemplary embodiment.

FIGS. 4A to 4D schematically illustrate cross sections of the device 300.

DETAILED DESCRIPTION

Figure 1A:
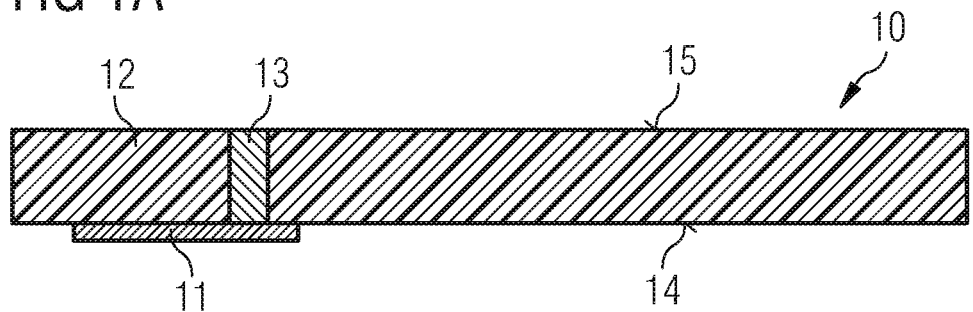
Figure 1B:
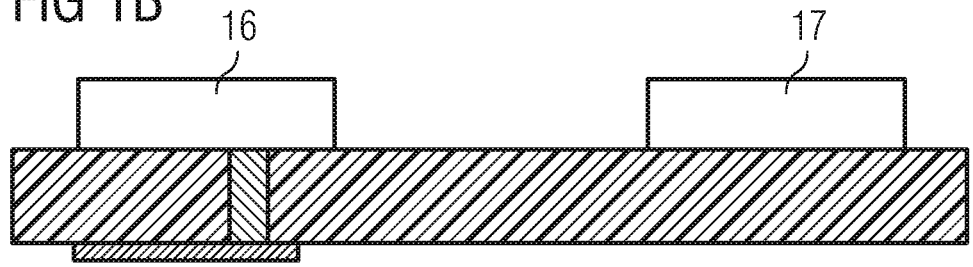
Figure 1C:
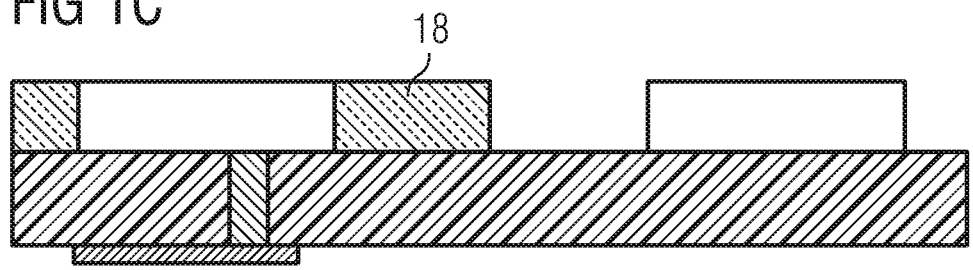
Figure 1D:
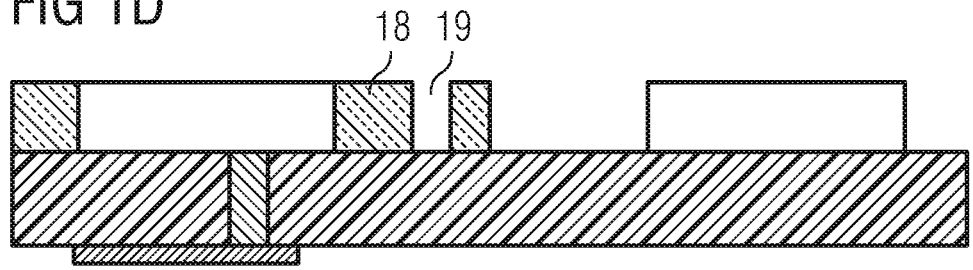

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with semiconductor chips are described below. The semiconductor chips may be of extremely different types and may include for example integrated electrical or electro-optical circuits. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include control circuits, microprocessors or microelectromechanical components. For example, semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure may have contact elements, for example, on its two main surfaces, that is to say on its top side and bottom side.

For example, power semiconductor chips may have a vertical structure. By way of example, the source electrode and gate electrode of a power MOSFET may be situated on one main surface, while the drain electrode of the power MOSFET is arranged on the other main surface. Furthermore, the devices described below may include integrated circuits to control the integrated circuits of other semiconductor chips, for example the integrated circuits of power semiconductor chips. The semiconductor chips need not be manufactured from specific semiconductor material, for example Si, SiC, SiGe, GaAs, and, furthermore, may contain inorganic and/or organic materials that are not semiconductors, such as for example insulators, plastics or metals. Moreover, the semiconductor chips may be packaged or unpackaged.

The semiconductor chips have electrodes (or contact pads) which allow electrical contact to be made with the integrated circuits included in the semiconductor chips. One or more metal layers may be applied to the electrodes of the semiconductor chips. The metal layers may be manufactured with any desired geometric shape and any desired material composition. The metal layers may, for example, be in the form of a layer covering an area. Any desired metal or metal alloy, for example aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The semiconductor chips may be mounted on carriers. The carrier may be of any shape, size or material. During the fabrication of the devices the carrier may be provided in a way that other carriers are arranged in the vicinity and are connected by connection means to said carrier with the purpose of separating said carriers.

The carriers may include an electrically insulating layer or may even be fabricated exclusively from electrically insulating materials. The electrically insulating layer of the carrier need not be homogenous or manufactured from just one material, that is to say various compositions and concentrations of the materials contained in the carrier are possible. For example, the electrically insulating layer may be fabricated from a ceramic insulator, such as $Al_2O_3$ or AlN. The carrier may, for example, be a DCB (Direct Copper Bonded) substrate which is a ceramic substrate on which one or more copper foils are attached. Alternatively, the carrier may, for example, be made from organic materials, such as imide, epoxy or other thermosetting materials, metal oxides, semiconductor oxides, ceramics or diamond-like carbon. Furthermore, the carrier may be a circuit board, for example a PCB.

The carrier may contain one or more electrically conducting layers, such as metal layers. Furthermore, one or more electrically conducting layers may be applied over the carrier, the semiconductor chip and/or any other component. The electrically conducting layers may be used as wiring layers to make electrical contact with the semiconductor chips from outside the devices or to make electrical contact with other semiconductor chips and/or components contained in the devices. Furthermore, the electrically conducting layers may be used as contact pads, for example external contact pads. The electrically conducting layers may be manufactured with any desired geometric shape and any desired material composition. The electrically conducting layers may, for example, be composed of conductor tracks, but may also be in the form of a layer covering an area.

Any desired electrically conducting materials, such as metals, for example aluminum, nickel, palladium, silver, tin, gold or copper, metal alloys, metal stacks or organic conductors, may be used as the material. The electrically conducting layers need not be homogenous or manufactured from just one material, that is to say various compositions and concentrations of the materials contained in the electrically conducting layers are possible. Furthermore, the electrically conducting layers may be arranged above or below or between dielectric layers. The electrically conducting layers may also be thermally conducting so that they can dissipate the heat generated by the semiconductor chips.

The carrier may include one or more through-connections. The through-connection may extend from a first face of the electrically insulating layer of the carrier to a second face of the electrically insulating layer. The through-connection is electrically conducting and may electrically couple an electrically conducting layer on the first surface to an electrically conducting layer on the second surface of the electrically insulating layer. The through-connections may, for example, be vias (vertical interconnect access). The through-connections may be manufactured by forming through-holes in the electrically insulating layer, for example by laser ablation, mechanical drilling or etching, and filling the through-holes with an electrically conducting material, which may be a metal, such as copper, aluminum, gold, or a metal alloy, such as SnAg or SnAu.

The devices may include one or more electrically insulating layers. The electrically insulating layers may cover any fraction of any number of surfaces of the components of the device. The electrically insulating layers may serve various functions. They may be used, for example, to electrically insulate components of the device from each other and/or from external components, but they may also be used as platforms to mount other components, for example wiring layers. The electrically insulating layers may be fabricated using various techniques. For example, the electrically insulating layers may be deposited from a gas phase or a solution or may be laminated as foils. The electrically insulating layers may, for example, be made from organic materials, such as imide, epoxy or other thermosetting materials, photoresist, silicon nitride, metal oxides, semiconductor oxides, ceramics or diamond-like carbon.

The devices described below include external contact elements or external contact pads, which may be of any shape and size. The external contact elements may be accessible from outside the device and may thus allow electrical contact to be made with the semiconductor chips from outside the device. Furthermore, the external contact elements may be thermally conducting and may serve as heat sinks for dissipating the heat generated by the semiconductor chips. The external contact elements may be composed of any desired electrically conducting material, for example of a metal, such as copper, aluminum or gold, a metal alloy or an electrically conducting organic material. The external contact elements may be leads of a leadframe.

The devices may include a mold material covering at least parts of the components of the devices. The mold material may be any appropriate thermoplastic or thermosetting material. Various techniques may be employed to cover the components with the mold material, for example compression molding, injection molding, powder molding or liquid molding.

FIGS. 1A to 1F schematically illustrate a method for production of a device 100. A cross section of the device 100 obtained by the method is illustrated in FIG. 1F. Firstly, a carrier 10 is provided (see FIG. 1A). The carrier 10 includes a first electrically conducting layer 11 and a first electrically insulating layer 12 over the first electrically conducting layer 11. Furthermore, at least one through-connection 13 is formed from a first surface 14 of the first electrically insulating layer 12 to a second surface 15 of the first electrically insulating layer 12. At least two semiconductor chips 16 and 17 are attached to the carrier 10 (see FIG. 1B). A second electrically insulating layer 18 is applied over the carrier 10 (see FIG. 1C). The second electrically insulating layer 18 is opened until the carrier 10 is exposed, for example a through-hole 19 may be formed in the second electrically insulating layer 18 (see FIG. 1D). A metal layer 20 is deposited over the opened second electrically insulating layer 18, for example the through-hole 19 may be filled with the metal (see FIG. 1E). After the deposition of the metal layer 20 the semiconductor chips 16 and 17 are separated (see FIG. 1F).

FIG. 2 schematically illustrates a device 200 including components similar or identical to the components of the device 100. Therefore similar or identical components of the devices 100 and 200 are denoted by the same reference numerals. In the device 200 a carrier 10 includes a first electrically conducting layer 11 and a first electrically insulating layer 12 over the first electrically conducting layer 11. At least one first through-connection 13 extends from a first surface 14 to a second surface 15 of the first insulating layer 12. A semiconductor chip 16 is attached to the carrier 10. A second electrically insulating layer 18 is deposited over the carrier 10 and the semiconductor chip 16. A metal layer 20 is deposited over the second electrically insulating layer 18. A second through-connection 21 through the second electrically insulating layer 18 electrically couples the semiconductor chip 16 to the metal layer 20. A third through-connection 22 through the second electrically insulating layer 18 electrically couples the carrier 10 to the metal layer 20.

Figure 3A:
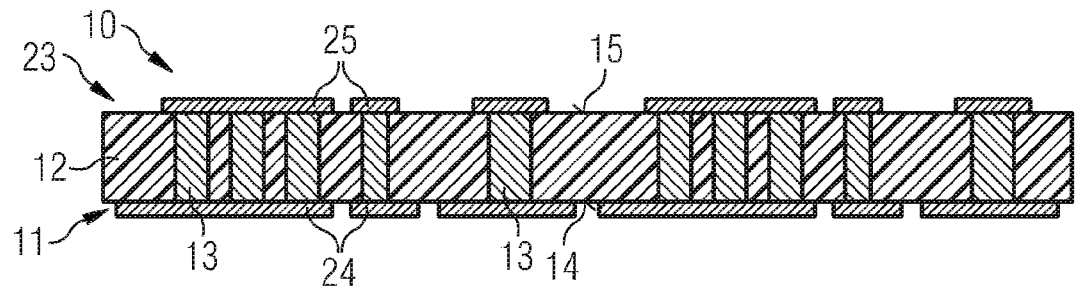
FIGS. 3A to 3G schematically illustrate an exemplary embodiment of a method to fabricate a device 300.
Figure 3B:
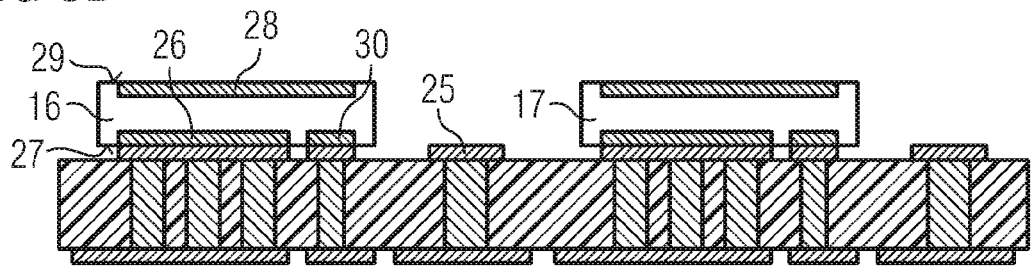
Figure 3C:
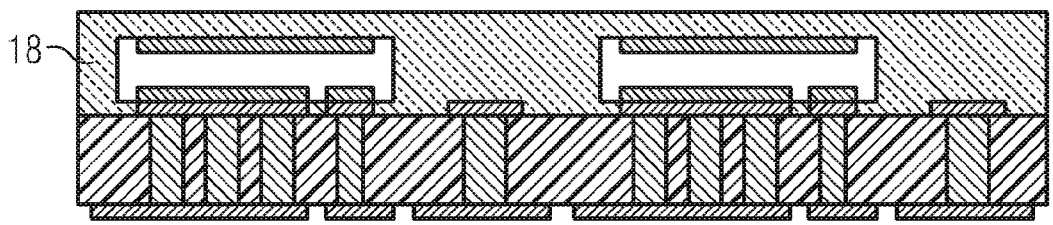
Figure 3D:
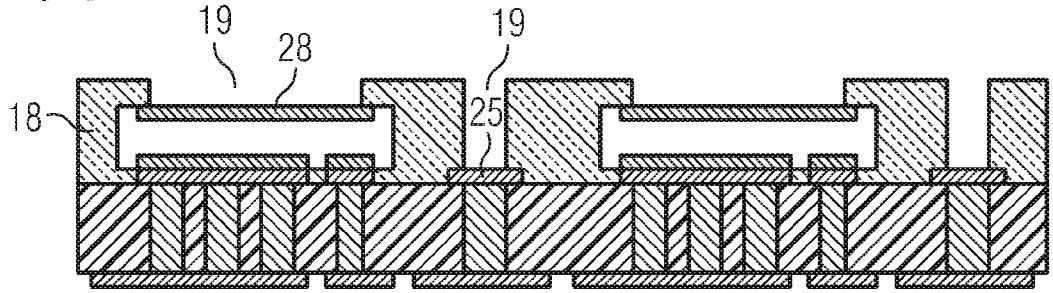
Figure 3E:
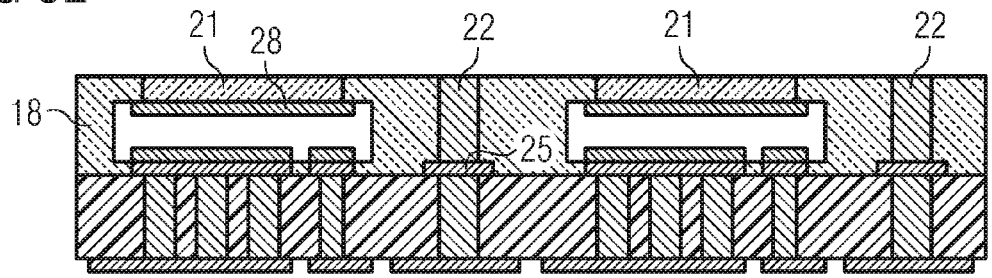
Figure 3F:
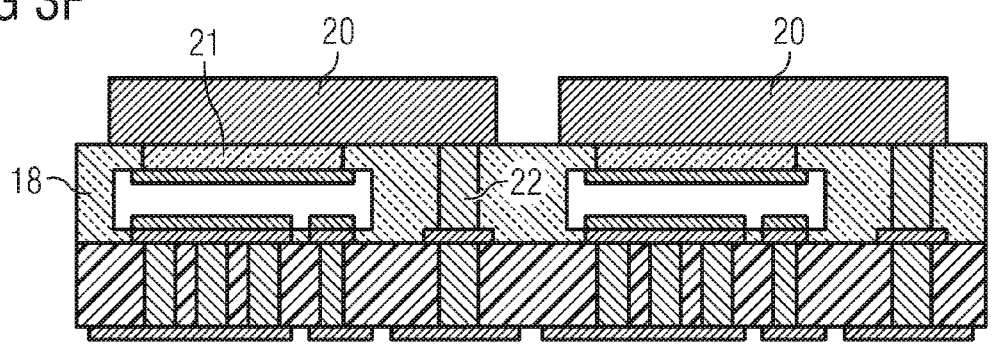
Figure 3G:
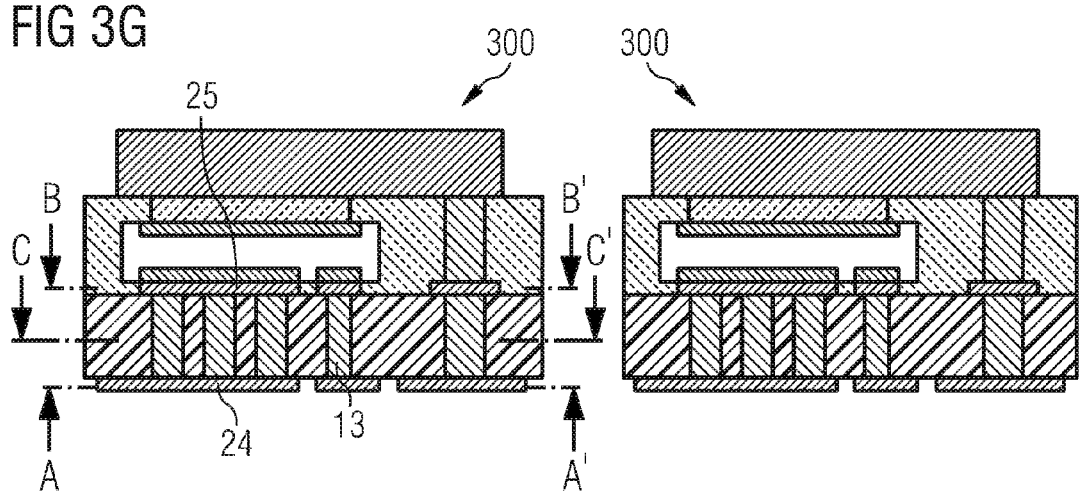

FIGS. 3A to 3G schematically illustrate a method for production of a device 300, a cross section of which is illustrated in FIG. 3G. The method illustrated in FIGS. 3A to 3G is an implementation of the method illustrated in FIGS. 1A to 1F. Furthermore, the device 300 is an implementation of the device 200 illustrated in FIG. 2. The details of the production method that are described below can therefore be likewise applied to the method of FIGS. 1A to 1F. Moreover, the details of the device 300 can be likewise applied to the devices 100 and 200.

In FIG. 3A the carrier 10 is provided. The electrically insulating layer 12 of the carrier 10 may be a plate made of a rigid material and may have flat surfaces 14 and 15 on which the electrically conducting layers as well as the components of the device 300 to be fabricated may be placed. The shape of the carrier 10 is not limited to any size or geometric shape, for example the carrier 10 may be round or square-shaped. The carrier 10 may have a thickness in the range from 100 µm to 1 mm or may be even thicker. The electrically insulating layer 12 may, for example, be fabricated from a ceramic material, such as $Al_2O_3$ or AlN, organic materials, such as imide, epoxy or other thermosetting materials, metal oxides, semiconductor oxides, or diamond-like carbon. Furthermore, the carrier 10 may be a circuit board, for example a PCB (Printed Circuit Board). The electrically insulating layer 12 may, for example, be made of phenolic paper, glass fiber and/or different plastics. Moreover, prepregs (short for preimpregnated), which are a combination of glass fiber mat, nonwoven material and resin, may be used for the electrically insulating layer 12. Prepreg materials that may be used are FR-2, FR-3, FR-4, FR-5, FR-6, G-10, CEM-1, CEM-2, CEM-3, CEM-4 and CEM-5.

The electrically conducting layer 11 may have been deposited on the first surface 14 of the electrically insulating layer 12 and an electrically conducting layer 23 may have been deposited on the second surface 15 of the electrically insulating layer 12. The electrically conducting layers 11 and 23 may be made from any desired electrically conducting materials, such as metals, for example aluminum, nickel, palladium, silver, tin, gold or copper, or metal alloys. Both electrically conducting layers 11 and 23 may be structured to obtain contact pads 24 on the first surface 14 and contact pads 25 on the second surface of the electrically insulating layer 12. The contact pads 24 and 25 may be manufactured with any desired geometric shape. The through-connections 13 may electrically couple the contact pads 24 on the first surface 13 to the contact pads 25 on the second surface of the electrically insulating layer 12. The through-connections 13 may be through-holes through the electrically insulating layer 12 filled with a metal, such as copper, aluminum, gold, or a metal alloy, such as SnAg or SnAu. Each contact pad 24 may be electrically coupled to a respective contact pad 25 by one or more through-connections 13.

The carrier 10 as illustrated in FIG. 3A may be pre-fabricated. This means that the carrier 10 may be provided before the manufacturing of the device 300 is started.

As illustrated in FIG. 3B, the semiconductor chips 16 and 17 as well as possibly further semiconductor chips are placed over the carrier 10. The semiconductor chips 16 and 17 as well as all other semiconductor chips described herein may have been fabricated on a wafer made of semiconductor material. After dicing the wafer and thereby separating the individual semiconductor chips 16 and 17, the semiconductor chips 16 and 17 are relocated on the carrier 10 in larger spacings as they have been in the wafer bond. The semiconductor chips 16 and 17 may have been manufactured on the same wafer, but may alternatively have been manufactured on different wafers. Furthermore, the semiconductor chips 16 and 17 may be physically identical, but may also contain different integrated circuits.

The semiconductor chips 16 and 17 may have a first electrode 26 on a first main surface 27 and a second electrode 28 on a second main surface 29 that is opposite to the first main surface 27. The semiconductor chips 16 and 17 may, for example, be vertical power diodes or vertical power transistors, for example IGBTs, JFETs, power bipolar transistors or power MOSFETs. In the latter case, which is exemplarily illustrated in FIG. 3B, the first and second electrodes 26 and 28 may be source and drain electrodes, respectively. Furthermore, the semiconductor chips 16 and 17 may have a third electrode 30 on the first main surface 27 functioning as a gate electrode in the case the semiconductor chips 16 and 17 are power MOSFETs. During operation of the device 300, voltages up to 1000 V may be applied between the source electrode 26 and the drain electrode 28. The switching frequency applied to the gate electrode 30 may be in the range from 100 kHz to 1 MHz, but may also be outside this range.

The semiconductor chips 16 and 17 are mounted onto the carrier 10 with their first main surfaces 27 facing the carrier 10. Each of the source electrodes 26 and gate electrodes 30 may be electrically connected to a respective contact pad 25.

The electrical connections between the source electrodes 26 and the gate electrodes 30 of the semiconductor chips 16 and 17 and the electrically conducting layer 23 may, for example, be produced by diffusion soldering. For that, a solder material may be deposited on the contact pads 25 or the source and gate electrodes 26 and 30 (not illustrated), for example by sputtering or other appropriate physical or chemical deposition methods. The solder material may have a thickness in the range from 100 nm to 10 µm, for example, in the range from 1 to 3 µm. During the soldering operation, the solder material diffuses into the adjacent materials, which leads to an intermetallic phase at the interface between the semiconductor chips 16 and 17 and the contact pads 25. The solder material may, for example, consist of AuSn, AgSn, CuSn, Sn, AuIn, AgIn, AuSi or CuIn.

For producing the soldered joint, the carrier 10 may be heated by a hot plate to a temperature above the melting point of the solder material, for example in the range from 200 to 400° C., for example, in the range from 330 to 350° C. Alternatively, both the carrier 10 and the semiconductor chips 16 and 17 may be placed in an oven and heated to an appropriate temperature. A pick-and-place tool may be used capable of picking the semiconductor chips 16 and 17 and placing them on the heated carrier 10. During the soldering process the semiconductor chips 16 and 17 may be pressed onto the carrier 10 for an appropriate time in the range from 10 to 200 ms, for example, around 50 ms.

Instead of a diffusion soldering process, other connection techniques may be used to attach the semiconductor chips 16 and 17 to the carrier 10, for example soft soldering or adhesive bonding by means of an electrically conducting adhesive. When using a soft soldering process to join the semiconductor chips 16, 17 and the carrier 10 to each other, solder material remains at the interfaces between the semiconductor chips 16, 17 and the carrier 10 after the soldering process has been finished. In case of adhesive bonding, an electrically conducting adhesive may be used, which may be based on filled or unfilled polyimides, epoxy resins, acrylate resins, silicone resins or mixtures thereof and may be enriched with gold, silver, nickel or copper in order to produce electrical conductivity.

The electrically insulating layer 18 may be deposited on the exposed parts of the top surface of the carrier 10 and the semiconductor chips 16 and 17 (see FIG. 3C). The maximum thickness of the electrically insulating layer 18 may be greater than the thickness of the semiconductor chips 16 and 17. The electrically insulating layer 18 may be laminated as a foil or sheet onto the underlying structures by applying vacuum as well as heat and pressure for a suitable time. It may also be provided that an electrically insulating material is deposited from a solution or a gas phase and may be built-up in a layer-by-layer fashion to a desired thickness. Techniques that can be employed for this kind of deposition are, for example, physical or chemical vapor deposition, spinning, dispensing, dipping, spraying, injection molding or compression molding. The electrically insulating layer 18 may be fabricated from a polymer, such as parylene, a photoresist material, imide, epoxy, duroplast, a silicone, a mold material, silicon nitride or an inorganic, ceramic-like material, such as silicone-carbon compounds.

The electrically insulating layer 18 may cover the semiconductor chips 16 and 17 as illustrated in FIG. 3C. Alternatively, at least the second main surfaces 29 of the semiconductor chips 16 and 17 may be left exposed.

The electrically insulating layer 18 may be structured as illustrated in FIG. 3D. A plurality of cutouts or through-holes 19 are created in the electrically insulating layer 18 to expose at least portions of the drain electrodes 28 of the semiconductor chips 16 and 17 as well as portions of at least some of contact pads 25 which are not covered by the semiconductor chips 16 and 17. This allows electrical connections to be made to those exposed regions. The electrically insulating layer 18 may, for example, be structured by a stamping process, laser ablation, etching, photo-lithographic structuring, mechanical drilling or any other suitable process known to a person skilled in the art.

In a further embodiment, which is not illustrated in the Figures, the electrically insulating layer 18 is provided as a polymer foil or sheet with a plurality of cutouts or through-holes 19 before it is laminated onto the carrier 10. The cutouts or through-holes 19 may be provided by stamping out regions of the polymer foil or sheet. The size and arrangement of these regions correspond to the size and arrangement of the surfaces of the elements, which are desired to be exposed.

The cutouts or through-holes 19 produced in the electrically insulating layer 18 may be filled with an electrically conducting material in order to form the through-connections 21 and 22 in the electrically insulating layer 18 (see FIG. 3E). The through-connections 21 are formed on top of the drain electrodes 28, and the through-connections 22 are formed on top of the exposed contact pads 25. The electrically conducting material of the through-connections 21 and 22 may be a metal, such as copper or aluminum, or a metal alloy, such as SnAg or SnAu. The through-connections 21 and 22 may be produced by employing the same or similar methods as described below in connection with the production of the metal layer 20, for example electrochemical plating processes. The through-connections 21 and/or 22 may have a cross section area which may be larger than 10% or 20% or 30% or 40% or 50% of the area of the main surface 27 of the semiconductor chip 16.

The electrically insulating layer 18 may act as a platform for the deposition of the metal layer 20 (see FIG. 3F). The thickness of the metal layer 20 may be greater than the thickness of the semiconductor chips 16 and 17. The metal layer 20 may have a thickness in the range from 80 to 400 µm, for example, in the range from 100 to 300 µm or in the range from 150 to 250 µm. The metal layer 20 may be structured as illustrated in FIG. 3F so that only some areas of the electrically insulating layer 18 are covered by the metal layer 20. For example, the metal layer 20 may electrically couple each through-connection 21 to one or more of the through-connections 22. Copper, iron, nickel, aluminum or other metals or metal alloys may be used as materials for the metal layer 20.

The metal layer 20 may be fabricated by using a galvanic deposition method. For that, a seed layer is first deposited onto the top surfaces of the electrically insulating layer 18 and the through-connections 21, 22. The seed layer usually has a thickness of some hundred nanometers. Materials such as palladium or titanium may be used for the seed layer.

The thickness of the seed layer may be increased by depositing a further layer of an electrically conducting material onto the seed layer. For example, a layer of copper may be electroless deposited onto the seed layer. This copper layer may have a thickness of less than 1 µm. Afterwards another layer of copper may be galvanically deposited, which may have a thickness of more than 10 µm. The electroless copper deposition may also be omitted. The metal layer 20 may be structured after the completed deposition process of all its layers or after the deposition of the seed layer.

Alternatively, the seed layer may be deposited by a vacuum deposition process, such as sputtering. For example, first a layer of titanium having a thickness of, for example, about 50 nm and afterwards a layer of copper having a thickness of, for example, about 200 nm are sputtered. The copper layer may then be used as a seed layer to galvanically deposit a further copper layer having a thickness of more than 10 µm.

As further alternatives, other deposition methods, such as physical vapor deposition, chemical vapor deposition, spin-on processes, spray deposition or ink jet printing may also be used. Furthermore, the metal layer 20 may be a metal film, for example a copper film, which is laminated onto the top surfaces of the electrically insulating layer 18 as well as the through-connections 21 and 22. Vacuum, heat and pressure may be applied for a time suitable to attach the metal layer 20 to the underlying materials.

As illustrated in FIG. 3G, the two semiconductor chips 16 and 17 as well as all other semiconductor chips placed over the carrier 10 are separated from one another by separation of the carrier 10 and the electrically insulating layer 18, for example by sawing, etching or a laser beam or other electromagnetic radiation.

FIGS. 4A to 4D illustrate cross sections of the device 300 along the lines A-A', B-B' and C-C' illustrated in FIG. 3G. In FIG. 4A a bottom view of the carrier 10 and in FIG. 4B a top view of the carrier 10 are illustrated. FIGS. 4A and 4B illustrate the geometries and the arrangements of the contact pads 24 and 25, respectively. It may be provided that a pair of contact pads 24, 25, which are coupled to each other via one or more through-connections 13, has different shapes. For example, the surface area of the contact pad 24 of such a pair may be larger than the surface area of the contact pad 25. Furthermore, their shapes may be different. In other words, the side 14 of the carrier 10 with the contact pads 24 has a pre-defined footprint for external connections, and the other side 15 of the carrier 10 has the contact pads 25 that match the contact pads or electrodes of the semiconductor chips 16 and 17. This way, footprint geometry and chip contact geometry are decoupled from each other. Furthermore, it is to be noted that the contact pads 24 coupled to the source electrode 26 and the gate electrode 30 of the semiconductor chip 16 may extend beyond the semiconductor chip 16 and may be arranged at least partly outside of a region defined by the contour of the semiconductor chip 16 (see FIG. 3G).

FIGS. 4C and 4D illustrate two different embodiments of the cross sections of the through-connections 13. The contours of the contact pads 24 and 25 are illustrated in FIGS. 4C and 4D by dashed lines. As illustrated in FIG. 4C the cross sections of the through-connections 13 may be circular. Furthermore, at least the through-connections 13, which are coupled to the load electrodes of the semiconductor chips 16 and 17, such as the source and drain electrodes 26 and 28, may be arranged in arrays. FIG. 4D illustrates another embodiment of the through-connections 13. The through-connections 13 may be rectangular or circular or may have any other geometry. The through-connections 13 may be arranged as illustrated in FIGS. 4C and 4D or may be arranged in any other way.

Figure 5:
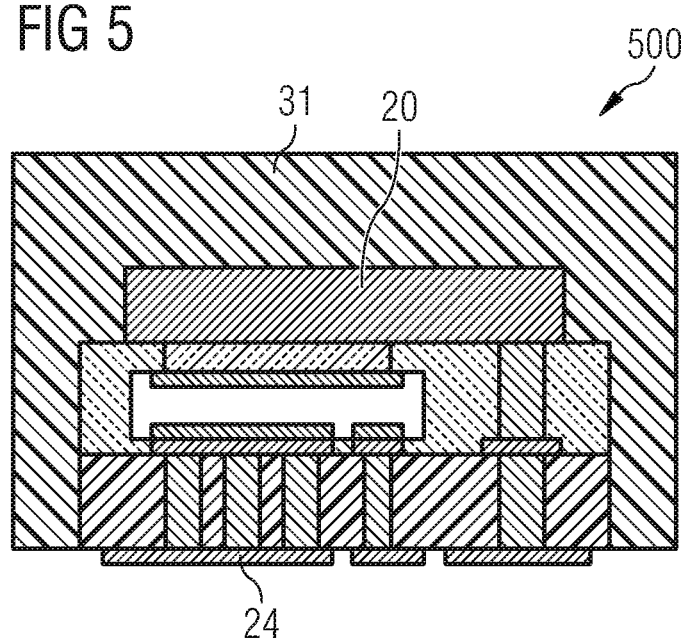
FIG. 5 schematically illustrates a device 500 as a further exemplary embodiment.

It may be provided that the metal layer 20 of the devices 300 is left exposed after the fabrication of the devices as illustrated in FIG. 3G. In this case, only voltages up to 20 V may, for example, be applied to the drain electrodes 28 during the operation of the devices 300. Alternatively, a ground potential may, for example, be constantly applied to the drain electrode 28 during operation. A further alternative is illustrated in FIG. 5. The device 500 depicted there includes a mold material 31 covering the metal layer 20 and the side surfaces of the device 500, thus providing an electrical insulation of the metal layer 20. In order to encapsulate the device 500, a mold transfer process may be carried out after the singulation of the semiconductor chips 16 and 17. The mold material 31 may encapsulate any portion of the device 500, but leaves at least parts of the contact pads 24 uncovered.

The mold material 31 may be composed of any appropriate thermoplastic or thermosetting material, for example, it may be composed of a material commonly used in contemporary semiconductor packaging technology. Various techniques may be employed to cover the components of the device 500 with the mold material 31, for example compression molding or injection molding.

Figure 6:
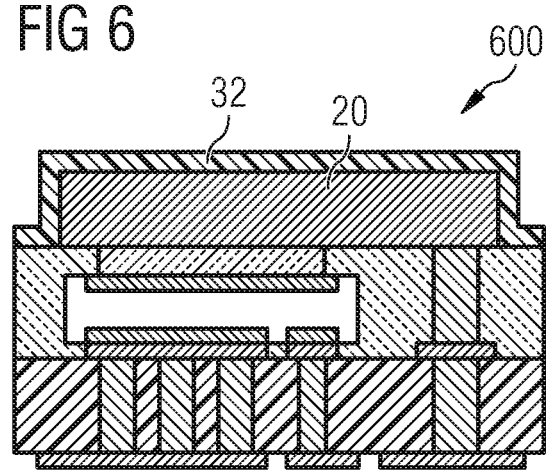
FIG. 6 schematically illustrates a device 600 as a further exemplary embodiment.

Instead of using the mold material 31, an electrically insulating layer 32 may cover the metal layer 20 as illustrated in FIG. 6. The electrically insulating layer 32 may, for example, be made from organic materials, such as imide, epoxy or duroplast, metal oxides, semiconductor oxides, ceramics or diamond-like carbon. The electrically insulating layer 32 may be deposited before the singulation of the semiconductor chips 16, 17 and may have a thickness in the range from 1 to 100 μm.

Figure 7:
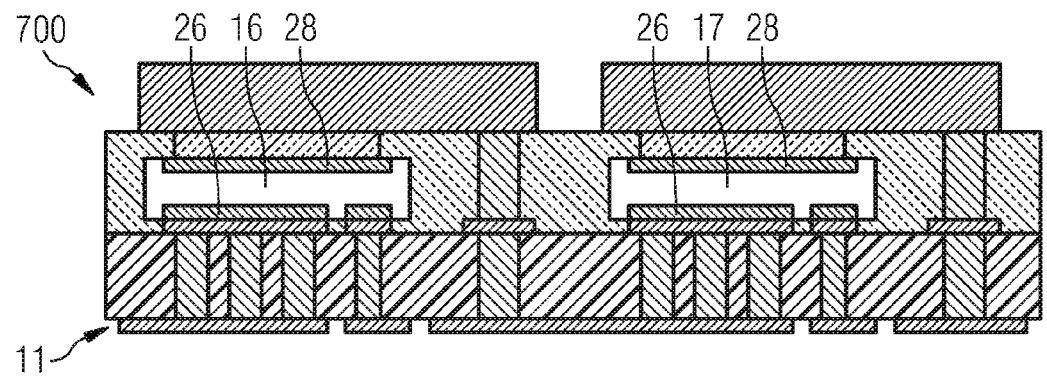
FIG. 7 schematically illustrates a device 700 as a further exemplary embodiment.

The devices 300, 500 and 600 are only intended to be exemplary embodiments, and a person skilled in the art understands that many variations are possible. For example, the devices may include more than one semiconductor chip. Such an embodiment is illustrated in FIG. 7. There, a device 700 is illustrated which is a modification of the device 300 and includes two semiconductor chips 16 and 17. The semiconductor chips 16 and 17 may be electrically coupled to each other by means of the electrically conducting layer 11. In the device 700 illustrated in FIG. 7 the drain electrode 28 of the semiconductor chip 16 is electrically coupled to the source electrode 26 of the semiconductor chip 17.

Figure 8:
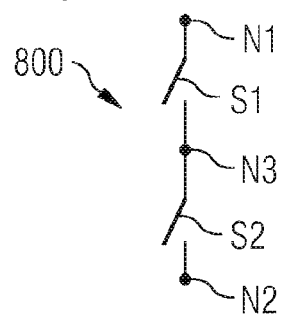
FIG. 8 illustrates a basic circuit of a half-bridge 800.

Having the connection as illustrated in FIG. 7, the device 700 can be used as a half-bridge. A basic circuit of a half-bridge 800 arranged between two knots N1 and N2 is illustrated in FIG. 8. The half-bridge 800 consists of two switches S1 and S2 connected in series. The semiconductor chips 16 and 17 may be implemented as the two switches S1 and S2, respectively. When compared to the device 700 illustrated in FIG. 7, the node Ni is the source electrode 26 of the semiconductor chip 16, the node N3 arranged between the two switches S1 and S2 is the drain electrode 28 of the semiconductor chip 16, and the node N2 is the drain electrode 28 of the semiconductor chip 17.

The half-bridge 800 may, for example, be implemented in electronic circuits for converting DC voltages, so-called DC-DC converters. DC-DC converters may be used to convert a DC input voltage provided by a battery or a rechargeable battery into a DC output voltage matched to the demand of electronic circuits connected downstream. DC-DC converters may be embodied as step-down converters, in which the output voltage is less than the input voltage, or as step-up converters, in which the output voltage is greater than the input voltage. Frequencies of several MHz or higher may be applied to DC-DC converters. Furthermore, currents of up to 50 A or even higher may flow through the DC-DC converters.

Figure 9:
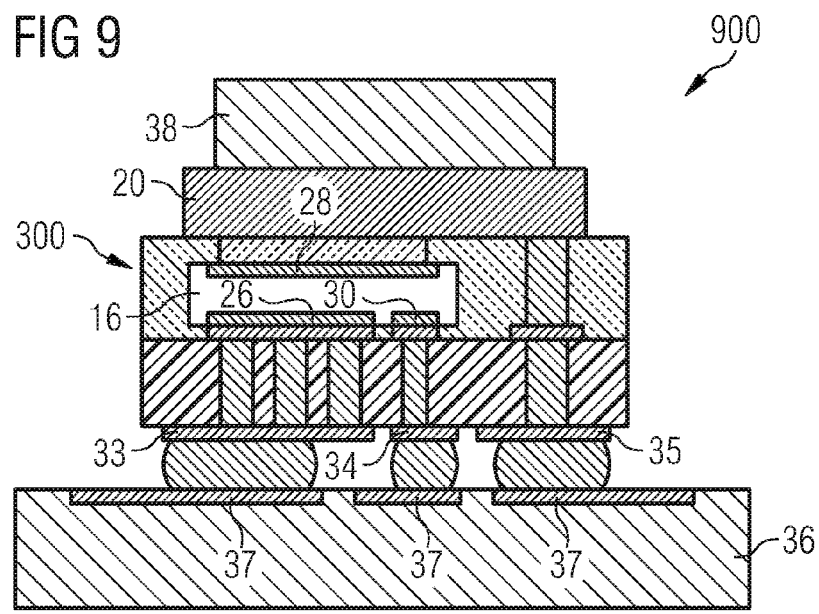
FIG. 9 schematically illustrates a device 900 as a further exemplary embodiment.

As exemplarily illustrated in FIG. 9, the exposed surfaces of the contact pads 24 may be used as external contact pads 33, 34 and 35 to electrically couple the device 300 to other components. In FIG. 9 an excerpt of a device 900 is schematically illustrated which includes the device 300 that is mounted onto a circuit board 36, for example a PCB. The exposed surfaces of the external contact pads 33 to 35 may have been soldered to contact pads 37 of the circuit board 36. In FIG. 9 the external contact pads 33, 34 and 35 are electrically coupled to the source electrode 26, the gate electrode 30 and the drain electrode 28 of the semiconductor chip 16, respectively.

The large surface areas of the external contact pads 33 to 35 allow to attach the device 300 to the circuit board 36, although the arrangement of the contact pads 37 on the circuit board 36 is quite different from the arrangement of the contact pads 25 that match the contact elements of the semiconductor chip 16.

On top of the device 300, a heat sink or cooling element 38 may be attached. The heat sink or cooling element 38 may be placed directly on top of the metal layer 20 or may be electrically insulated from the metal layer 20 by the mold material 31 or the electrically insulating layer 32 illustrated in FIGS. 5 and 6. The heat sink or cooling element 38 dissipates the heat generated by the semiconductor chip 16 during operation.

Figure 10A:
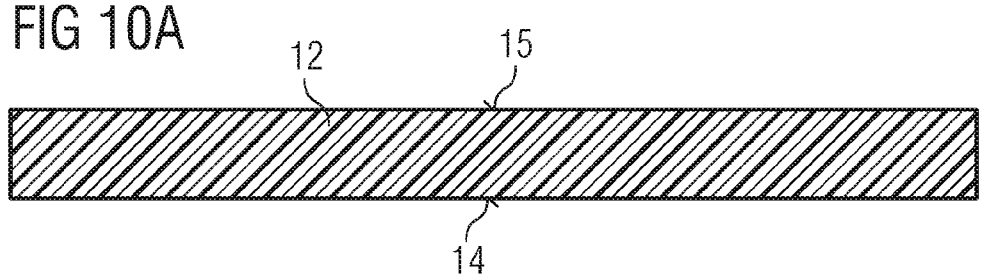
FIGS. 10A to 10J schematically illustrate an exemplary embodiment of a method to fabricate a device 1000.
Figure 10B:
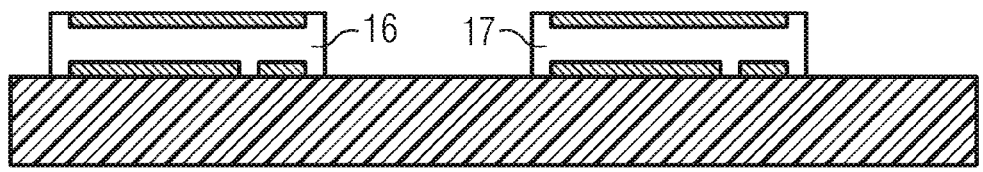
Figure 10C:
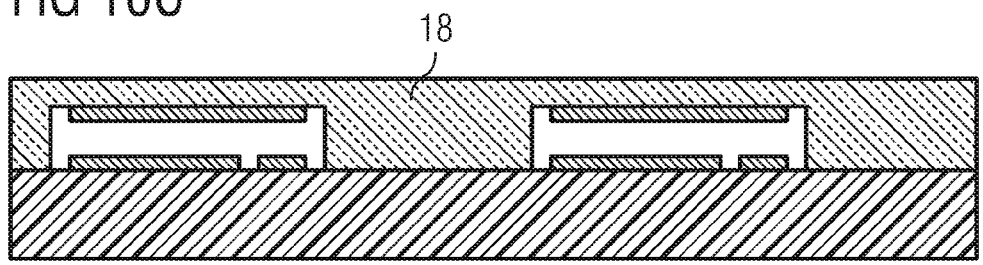
Figure 10D:
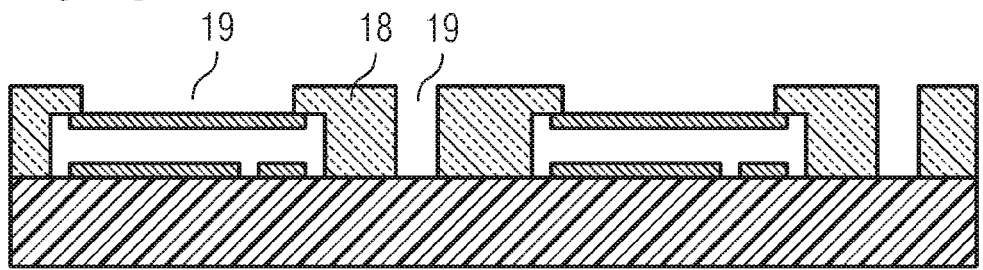
Figure 10E:
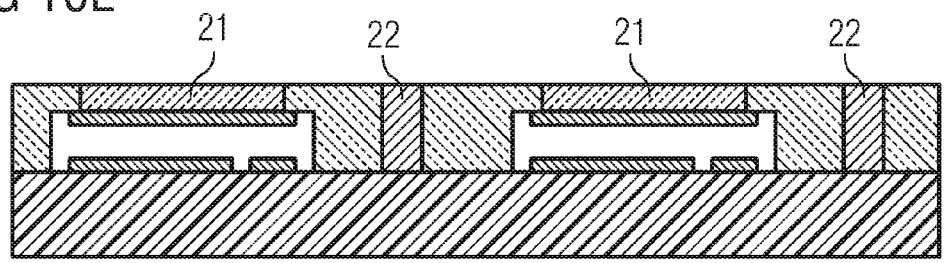
Figure 10F:
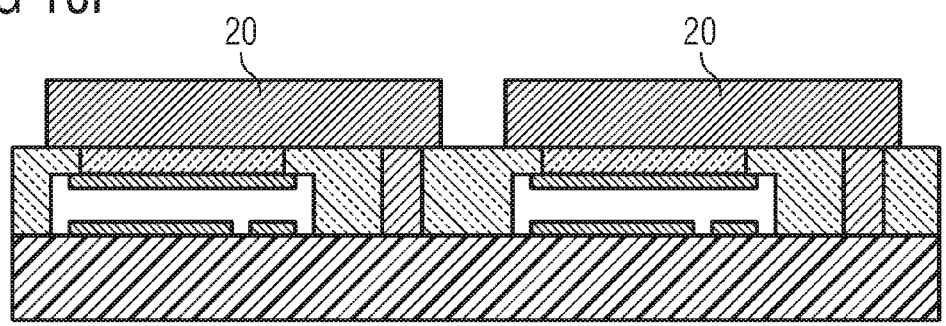
Figure 10G:
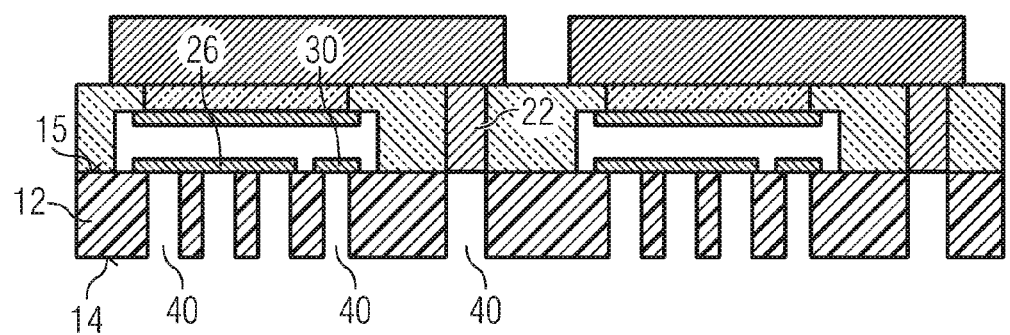
Figure 10H:
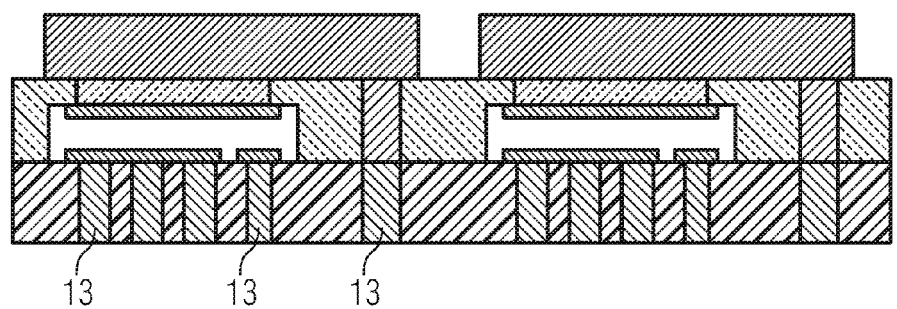
Figure 10I:
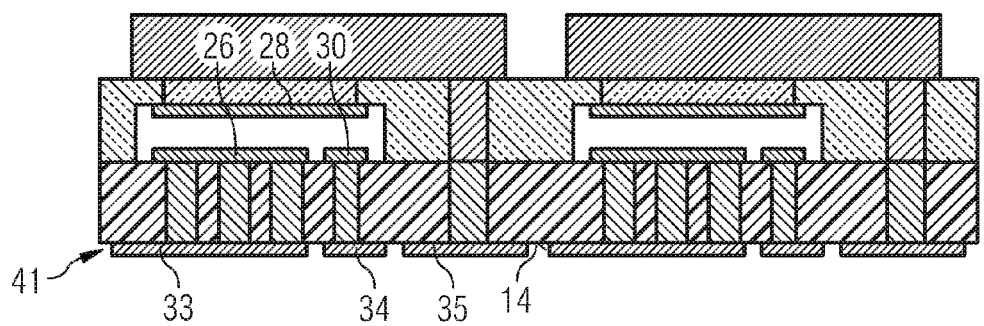
Figure 10J:
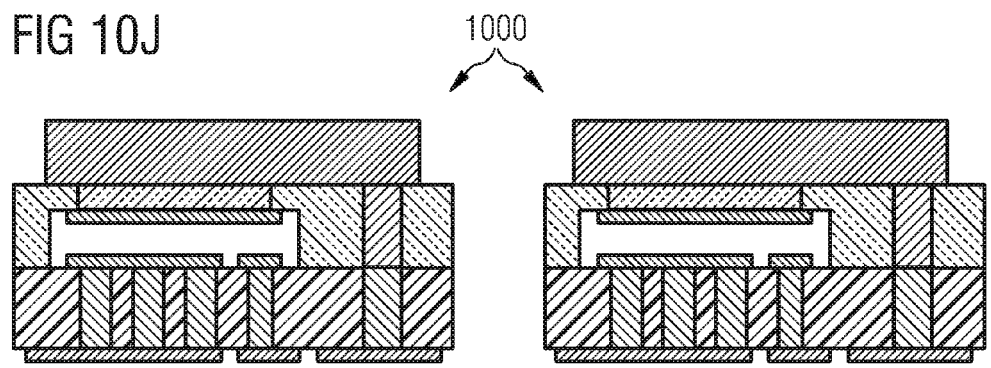

FIGS. 10A to 10J schematically illustrate a method for production of a device 1000, a cross section of which is illustrated in FIG. 10J. The method presented in FIGS. 10A to 10J illustrates some similarities to the method illustrated in FIGS. 3A to 3G. Therefore similar or identical components used in both methods are denoted by the same reference numerals. Furthermore, in the following it is sometimes referred to the method of FIGS. 3A to 3G if the same method steps can be carried out as described above.

In FIG. 10A an electrically insulating carrier 12 is provided. The electrically insulating carrier 12 may be a plate made of a rigid material and may have flat surfaces 14 and 15 on which the components of the device 1000 to be fabricated may be placed. The shape of the carrier 12 is not limited to any size or geometric shape, for example the carrier 12 may be round or square-shaped. The carrier 12 may have a thickness in the range from 100 μm to 1 mm or may be even thicker. The carrier 12 may for example be fabricated from a ceramic material, such as $Al_2O_3$ or AlN, organic materials, such as imide, epoxy or other thermosetting materials, metal oxides, semiconductor oxides, or diamond-like carbon. Furthermore, the carrier 12 may be made from the same material as a circuit board, for example phenolic paper, glass fiber and/or different plastics. Moreover, prepregs may be used for the carrier 12, such as FR-2, FR-3, FR-4, FR-5, FR-6, G-10, CEM-1, CEM-2, CEM-3, CEM-4 and CEM-5.

As illustrated in FIG. 10B, the semiconductor chips 16 and 17 as well as possibly further semiconductor chips are placed over the carrier 10 as described in connection with FIG. 3B. The semiconductor chips 16 and 17 may, for example, be vertical power diodes or vertical power transistors, for example IGBTs, JFETs, power bipolar transistors or power MOSFETs.

The electrically insulating layer 18 may be deposited on the exposed parts of the second surface 15 of the carrier 12 and the semiconductor chips 16 and 17 (see FIG. 10C) as described in connection with FIG. 3C. The structuring of the electrically insulating layer 18 (see FIG. 10D) may be similar to the structuring as illustrated in FIG. 3D. Afterwards the through-holes 19 produced in the electrically insulating layer 18 may be filled with an electrically conducting material (see FIG. 10E) and the metal layer 20 may be deposited (see FIG. 10F) as described above in connection with FIGS. 3E and 3F.

The electrically insulating carrier 12 may be structured as illustrated in FIG. 10G. A plurality of through-holes 40 are created in the carrier 12 to expose at least portions of the source electrodes 26 and the gate electrodes 30 of the semiconductor chips 16 and 17 as well as at least portions of the bottom surfaces of the through-connections 22. This allows electrical connections to be made to those exposed regions. The through-holes 40 extend from the first surface 14 to the second surface 15 of the electrically insulating carrier 12. The through-holes 40 may be produced, for example, by a stamping process, laser ablation, etching, photo-lithographic structuring, mechanical drilling or any other suitable process known to a person skilled in the art.

The through-holes 40 produced in the carrier 12 may be filled with an electrically conducting material in order to form the through-connections 13 in the carrier 12 (see FIG. 10H). The electrically conducting material of the through-connections 13 may be a metal, such as copper or aluminum, or a metal alloy, such as SnAg or SnAu. The through-connections 13 may be produced by employing the same or similar methods as described above in connection with the production of the metal layer 20.

As illustrated in FIG. 10I, an electrically conducting layer 41 may be deposited on the first surface 14 of the electrically insulating carrier 12 using the same or similar methods as described above in connection with the production of the metal layer 20, for example electrochemical plating processes. The electrical conducting material used for the deposition of the electrically conducting layer 41 may be metals, such as copper or aluminum, or metal alloys. The electrically conducting layer 41 may have a thickness of more than 10 µm. The electrically conducting layer 41 may be structured to form the external contact pads 33, 34 and 35. The external contact pads 33, 34 and 35 are electrically coupled to the source electrodes 26, the gate electrodes 30 and the drain electrodes 28 of the semiconductor chips 16 and 17, respectively.

As illustrated in FIG. 10J, the two semiconductor chips 16 and 17 as well as all other semiconductor chips placed over the carrier 12 are separated from one another by separation of the carrier 12 and the electrically insulating layer 18, for example by sawing, etching or a laser beam or other electromagnetic radiation.

The embodiments of the device 300 illustrated in FIGS. 4 to 9 may be applied to the device 1000 in an analogous manner.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A device, comprising:
    a carrier comprising a first conducting layer, a first insulating layer over the first conducting layer, and a plurality of first through-connections from a first face of the first insulating layer to a second face of the first insulating layer;
    a second conducting layer over the first insulating layer;
    a semiconductor chip attached to the second conducting layer on the carrier;
    a second insulating layer over the carrier and the semiconductor chip;
    a metal layer over the second insulating layer;
    a second through-connection through the second insulating layer electrically coupling the semiconductor chip to the metal layer; and
    a third through-connection through the second insulating layer electrically coupling the carrier to the metal layer;
    wherein the plurality of first through-connections and second conducting layer electrically couple the first conducting layer to at least two discrete and separate locations on the semiconductor chip.

2. The device of claim 1, wherein the first conducting layer comprises a first contact pad, and the second conducting layer comprises a second contact pad.

3. The device of claim 2, wherein the shape of the first contact pad differs from the shape of the second contact pad.

4. The device of claim 2, wherein the surface area of the first contact pad is larger than the surface area of the second contact pad.

5. The device of claim 2, wherein the at least one first through-connection electrically couples the first contact pad to the second contact pad.

6. The device of claim 1, wherein the thickness of one of the metal layer and the second insulating layer is greater than the thickness of the semiconductor chip.

7. The device of claim 1, wherein one of the plurality of first through-connections electrically couple to a source of the semiconductor chip, one of the plurality of first through-connections electrically couple to a drain of the semiconductor chip, and one of the plurality of first through-connections electrically couple to a gate of the semiconductor chip.

8. The device of claim 1, wherein the first through-connection electrically couples to one of a source, drain and gate of the semiconductor chip and the third through-connection electrically couples to one of a source, drain and gate of the semiconductor chip.

9. A device, comprising:
a carrier comprising a first insulating layer, a first contact pad attached to a first face of the first insulating layer, a second contact pad attached to a second face of the first insulating layer, and at least one first through-connection through the first insulating layer electrically coupling the first contact pad to the second contact pad, the shape of the first contact pad being different from the shape of the second contact pad; and
a semiconductor chip over to the carrier and coupled to the second contact pad at a first location;
a second insulating layer over the carrier;
a metal layer over the second insulating layer and the semiconductor chip, the metal layer being electrically coupled to the semiconductor chip; and
a second through-connection through the second insulating layer electrically coupling the carrier to the metal layer;
wherein the carrier further comprises a third contact pad attached to the first face of the first insulating layer, a fourth contact pad attached to the second face of the first insulating layer and coupled to the semiconductor chip at a second location different than first location, and a third through-connection through the first insulating layer electrically coupling the third contact pad to the fourth contact pad.

10. The device of claim 9, wherein the surface area of the first contact pad is larger than the surface area of the second contact pad.

\* \* \* \* \*